United States Patent
Chang

(10) Patent No.: US 7,236,007 B1
(45) Date of Patent: Jun. 26, 2007

(54) METHODS AND SYSTEMS FOR ACHIEVING IMPROVED INTELLECTUAL PROPERTY PROTECTION FOR PROGRAMMABLE LOGIC DEVICES

(75) Inventor: Richard Y. Chang, Brooklyn, NY (US)

(73) Assignee: Altera Corporation, San Jose, CA (US)

( * ) Notice: Subject to any disclaimer, the term of this patent is extended or adjusted under 35 U.S.C. 154(b) by 55 days.

(21) Appl. No.: 10/949,481

(22) Filed: Sep. 24, 2004

(51) Int. Cl.
*H03K 19/177* (2006.01)
*G06F 12/14* (2006.01)

(52) U.S. Cl. .......................... 326/39; 326/38; 713/189

(58) Field of Classification Search ................ 326/37, 326/38, 39; 380/28; 713/100, 189, 191, 713/194
See application file for complete search history.

(56) References Cited

U.S. PATENT DOCUMENTS

| | | | |
|---|---|---|---|
| 5,745,734 A * | 4/1998 | Craft et al. | 716/16 |
| 6,366,117 B1 * | 4/2002 | Pang et al. | 326/38 |
| 2003/0068038 A1 * | 4/2003 | Hanounik | 380/37 |

* cited by examiner

*Primary Examiner*—Daniel Chang
(74) *Attorney, Agent, or Firm*—Townsend and Townsend and Crew LLP

(57) ABSTRACT

Methods and system for achieving improved copyright protection for programmable logic devices are disclosed. One preferred embodiment comprises a programmable logic device comprising a programmable element programmed by a mutated programming pattern, said mutated programming pattern causing the PLD to generate a mutated output; and a circuit element that translates the mutated output into a normal output.

21 Claims, 5 Drawing Sheets

US 7,236,007 B1

METHODS AND SYSTEMS FOR ACHIEVING IMPROVED INTELLECTUAL PROPERTY PROTECTION FOR PROGRAMMABLE LOGIC DEVICES

FIELD OF INVENTION

This invention is related in general to intellectual property protection technologies and in particular to methods and systems for achieving improved intellectual property protection for programmable logic devices.

BACKGROUND OF INVENTION

Programmable logic devices (PLD) such as field programmable gate arrays (FPGA) and complex programmable logic devices (CPLD) are digital logic circuits that can be programmed by certain "programming patterns" such as programmable object files (POFs) to perform logical functions. These devices have grown significantly in capability and complecity. Yet intellectual property (IP) protection embedded in such devices, such as the programming patterns, has not enjoyed similar development.

Currently, most IP protection schemes rely on encrypting/decrypting the programming patterns on chip. FIG. 1 shows a typical encryption/decryption IP protection scheme that includes a decrypter 120 that receives an encrypted POF 110 and a decryption key 160. The encrypted POF 110 is decrypted by the decrypter 120 using decryption key 160. The decrypted POF 130 is then used to program a programmable logic circuit 140. An output 170 of the programmable logic circuit 140 is coupled to a utility circuit 150. The drawback of this IP protection scheme is that it relies on a decryption key 160, which must be stored somewhere on the chip. As a result, this IP protection scheme is vulnerable to attack because it is not difficult for an attacker to reverse engineer the chip to obtain the decryption key.

In addition to being vulnerable to reverse engineering, storing a key on the chip may add production cost and complexity to chip manufacturers. For example, a battery must be used to store the encryption key in a SRAM FPGA. For an antifuse FPGA, extra fuses have to be blown to store the encryption key.

There is therefore a need to develop an IP protection scheme that achieves improved protection without using any decryption key.

SUMMARY OF INVENTION

In one aspect, the present invention comprises: a programmable element programmed by a mutated programming pattern, said mutated programming pattern causing the PLD to generate a mutated output; and a circuit element that translates the mutated output into a normal output.

In another aspect, the present invention comprises a method of copy-protecting the programming pattern of a PLD. The method comprises the steps of: fabricating a circuit element of the PLD, said circuit element capable of translating a mutated signal into a normal output signal of the PLD; and producing a programming pattern for programming the PLD, said programming pattern causing the PLD to generate the mutated signal.

In yet another aspect, the present invention comprises a method of producing a mutatable PLD. The method comprises the steps of: producing a plurality of programming patterns for programming the PLD, each programming pattern causing the PLD to generate one of a plurality of mutated signals; fabricating a plurality of circuit elements, each circuit element translating one of a plurality of mutated signals into a normal output of the PLD; and fabricating a switching element for selecting one of said circuit elements.

DETAILED DESCRIPTION OF PREFERRED EMBODIMENTS

Figure 1:
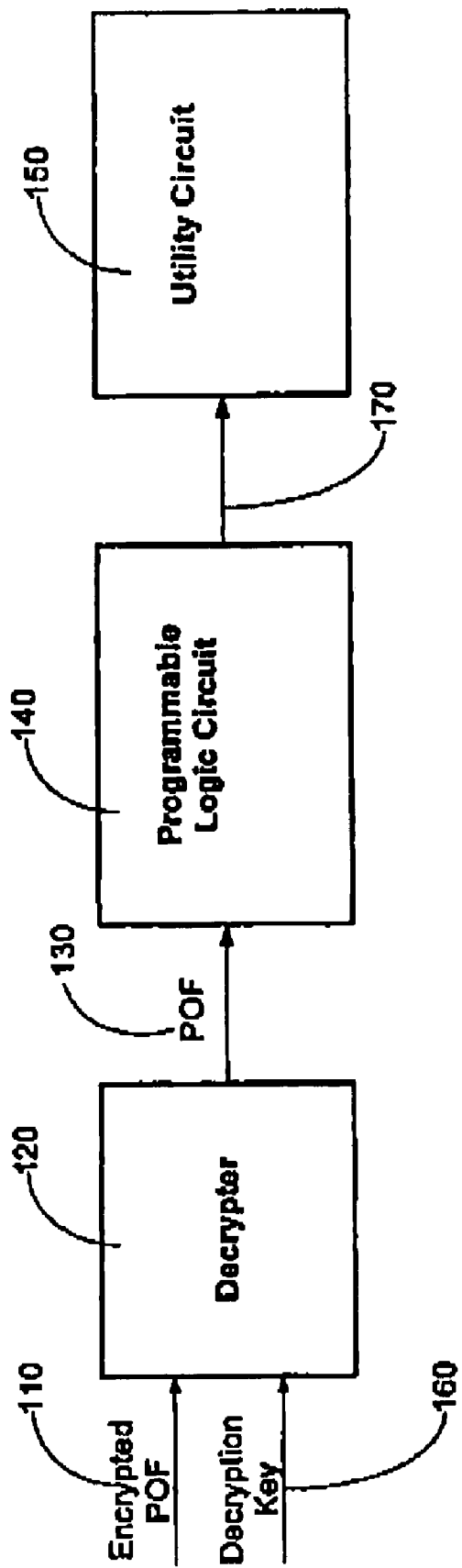
FIG. 1 shows a prior art encryption/decryption scheme.
Figure 2:
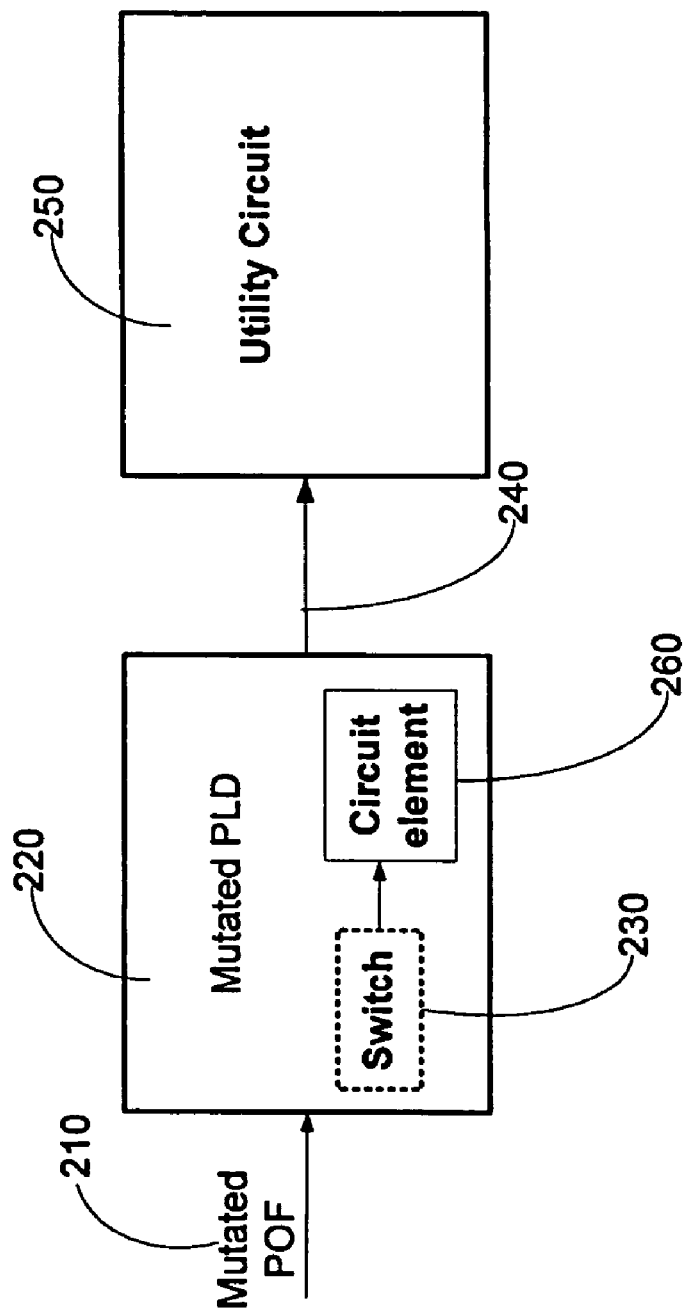
FIG. 2 shows one embodiment of the invention.

FIG. 2 shows one embodiment of the present invention. The system of FIG. 2 comprises a mutated PLD 220 programmed by a mutated programming pattern, or mutated POF 120. An output 240 of PLD 220 is applied to a utility circuit 250, which is intended to represent any circuit that might be connected to the output of a PLD. The mutated POF 210 is a POF that causes the mutated PLD 220 to generate a "mutated" output signal that causes the utility circuit 250 to function abnormally. The mutated POF 210 may be produced, for example, by altering a portion of the source code of a normal POF. The mutated PLD 220 also contains an additional circuit element 260. The additional circuit element 260 is capable of translating the mutated output signal to a normal output signal. Optionally, the system of FIG. 2 also contains a switch 230 for enabling or disabling the circuit element 260.

The system of FIG. 2 may be part of a system on a programmable chip (SOPC) using a PLD, such as a FPGA or a CPLD. The PLD 220 may be part of the core logic of the SOPC and the programming pattern used in the PLD 220 is often the target of attackers. The embodiment of FIG. 2 requires both the mutated programming pattern 210 and the mutated PLD 220 to generate a normal output signal 240. Thus, if the mutated programming pattern 210 were stolen by the attacker and used on a normal PLD, the normal PLD will generate a mutated output signal that will disrupt the operation of the utility circuit. Furthermore, even if the attacker were able to detect how the programming pattern 210 was mutated, it would not be easy job for him to reverse the mutation. This is because an attacker must either redesign the hardware of his PLD to add an additional circuit 260 to reverse the mutation, or reverse-engineer the mutated programming pattern 210 to remove the portion of the code that has been altered. Neither alternative is likely to be practical. FIG. 2's system, therefore, discourages piracy and ensures stronger protection of the programming pattern embedded in the PLD.

Figure 3:
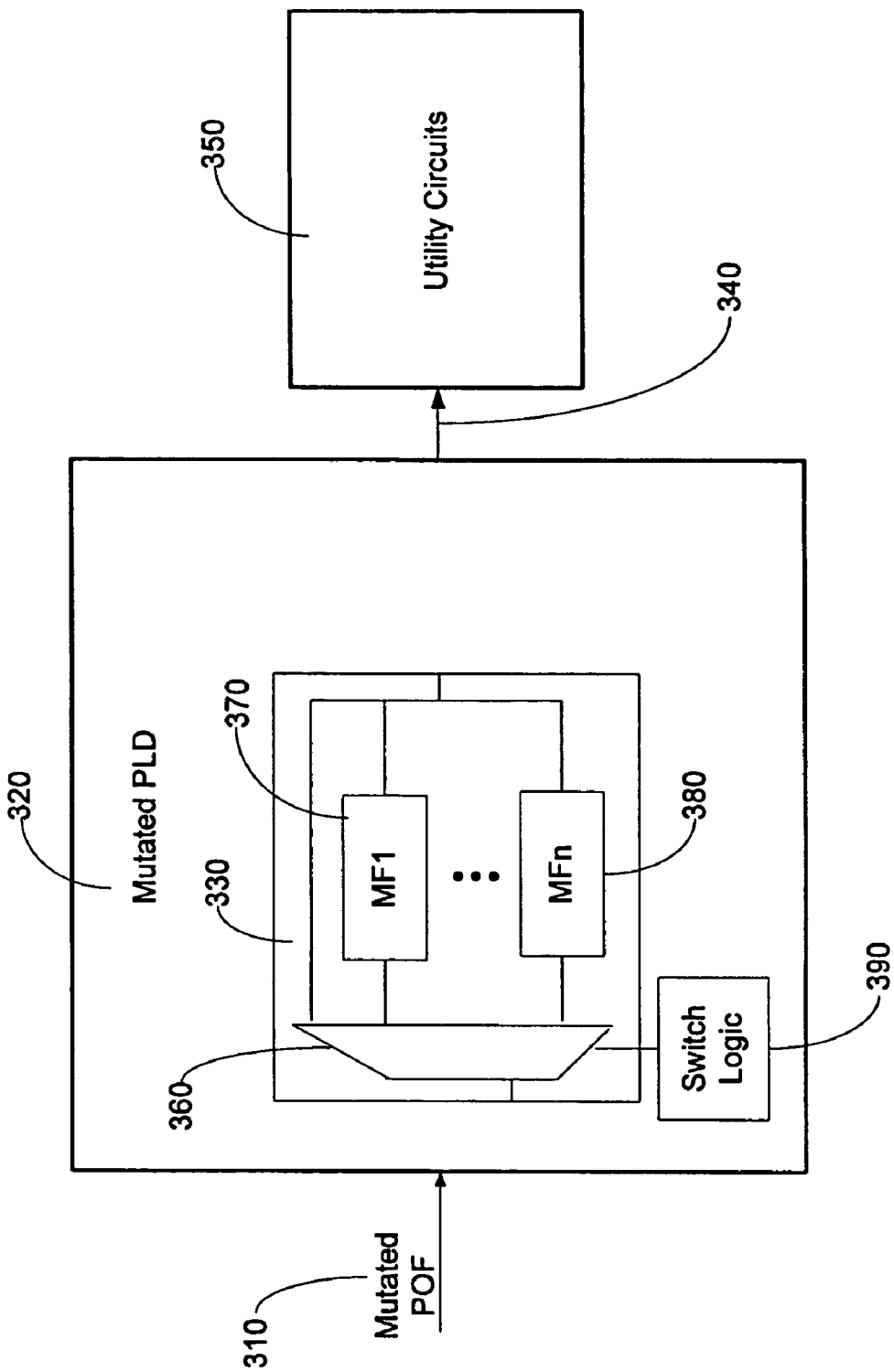
FIG. 3 shows another embodiment of the invention.

FIG. 3 shows another embodiment of the present invention. The system of FIG. 3 comprises a mutated PLD 320 that could be programmed by a plurality of mutated programming patterns, or mutated POFs 310. An output 340 of PLD 320 is applied to a utility circuit 350. Each mutated POF causes the PLD 320 to generate a mutated output signal. The mutated PLD 320 contains an circuit element 330 that is capable of selectively reversing the signal mutation caused by each one of the plurality of mutated POFs 310. Specifically, the circuit element 330 contains a plurality of circuit elements 370–380. Each one of these circuit elements performs a mutated function that translates a different one of the mutated output signals into a normal output signal.

In FIG. 3, all of the circuit elements 370–380 are connected to a selection MUX 360 controlled by a switch logic circuit 390. The switch logic circuit 390 may be coupled to a number of fuses and the user of the PLD 320 can select a circuit element by blowing one or more fuses. After detecting which fuses are blown, the switch logic circuit determines which corresponding circuit element should be selected and generates a control signal to MUX 360 informing it to switch to the selected circuit element. The selected switch element is then available to translate one of the mutated output signals into a normal output signal.

Figure 4:
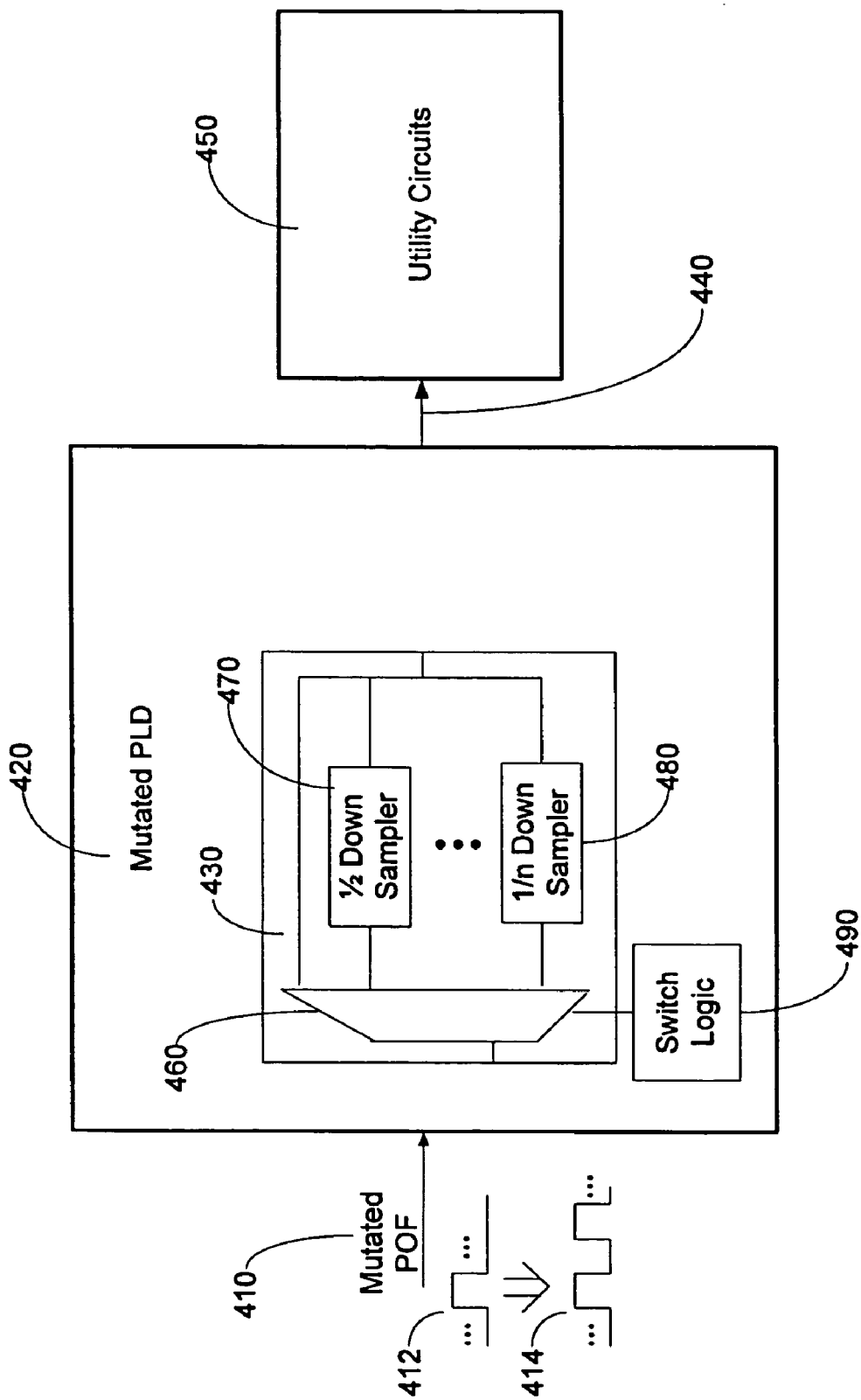
FIG. 4 describes another exemplary embodiment of the invention.

A specific embodiment of the system of FIG. 3 is shown in FIG. 4. The system of FIG. 4 comprises a mutated PLD 420 that can be programmed by a plurality of different mutated programming patterns, or mutated POFs 410. An output 440 of PLD 420 is applied to a utility circuit 350. Each mutated POF 410 performs an up-sampling function that causes the PLD 420 to output "n" pulses per single pulse in a normal output signal, where "n" is an integer number greater than 1. To recover the normal output signal, the mutated PLD 420 contains an circuit element 430 that contains a plurality of down-sampler circuits 470–480. Each one of these down-sampler circuits selects the first pulse of every 2, 3, . . . , or n pulses, thereby restoring the output signal 340 to its normal form.

Similar to FIG. 3, all of the down-sampler circuits 470–480 are connected to a MUX 460 for selection. The MUX 460 is controlled by a switch logic circuit 490. The user of the PLD 420 can select a down-sampler circuit corresponding to the up-sampling rate of the mutated POF 410. For example, if the POF 410 causes the PLD 420 to output 2 pulses per single pulse in the normal output signal, then the ½ down-sampler circuit 470 is selected by the switch logic circuit 490 to offset this.

Figure 5:
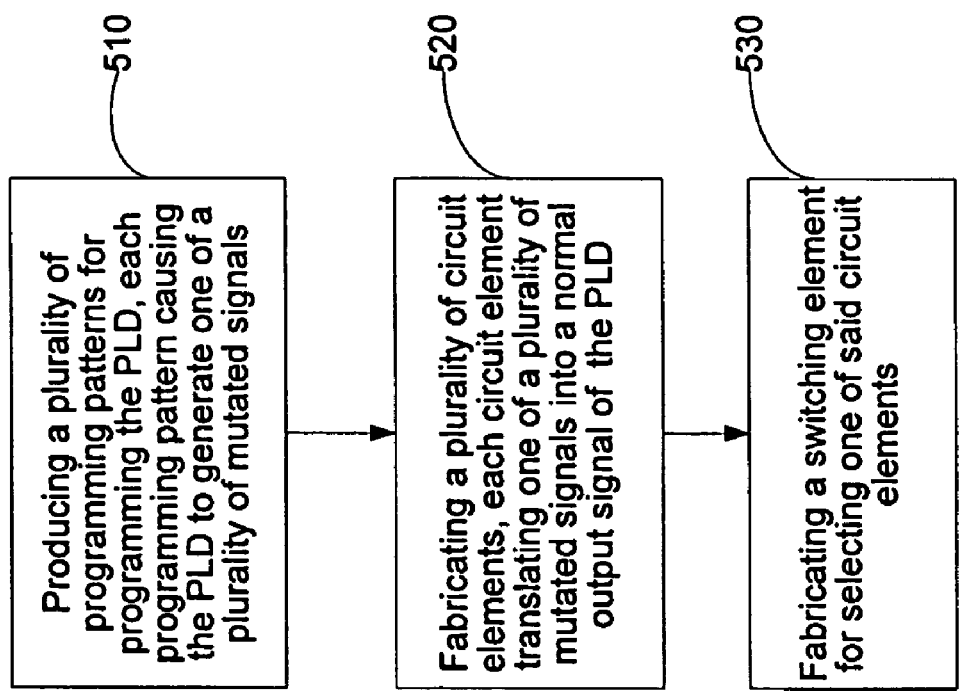
FIG. 5 describes one method of fabricating one embodiment of the invention.

FIG. 5 describes the steps for fabricating the system of FIG. 3 according to one embodiment of the present invention. In step 510, a plurality of programming patterns, such as the POFs 310 are produced for programming the PLD 320. Each programming pattern 310 causes the PLD 320 to generate one of a plurality of mutated signals. In step 520, a plurality of circuit elements 370–380 are fabricated. Each circuit element translates one of the plurality of mutated signals generated by the programming pattern 310 into a normal output signal. Finally, in step 530, the switching element 360 is fabricated for selecting one of the circuit elements 370–380. The designs of the programming pattern 310, the circuit elements 370–380 logic circuit 180, and the switching element 360 may be produced using commercially available design software such as the Quartus® II design software provided by Altera Corporation, San Jose, Calif.

While the above invention has been described with reference to certain preferred embodiments, the scope of the present invention is not limited to these embodiments. One skilled in the art may find variations of these embodiments which, nevertheless, fall within the spirit of the present invention, whose scope is defined by the claims set forth below.

I claim:

1. A programmable logic device (PLD) comprising:
    a programmable element programmed by a mutated programming pattern, the mutated programming pattern causing the programmable element to generate a mutated output causing the PLD to output the mutated output in response to the mutated programming pattern; and
    a circuit element that in response to the mutated output and without employing a decryption key translates the mutated output into a normal output causing the PLD to output a normal output in response to the mutated programming pattern.

2. The PLD of claim 1, wherein the circuit element further comprises a switch circuit for enabling or disabling the circuit element.

3. The PLD of claim 2, wherein the switch circuit further comprises a fuse logic circuit for detecting whether at least one pre-determined fuse is blown.

4. The PLD of claim 1 further comprising:
    a second mutated programming pattern causing the programmable element to generate a second mutated output when it is programmed by the second mutated programming pattern; and
    a second circuit element that translates into a normal output the second mutated output from the programmable element.

5. The PLD of claim 4 further comprising a switching element for switching between the circuit element and the second circuit element.

6. The PLD of claim 1 wherein the PLD is part of a FPGA.

7. The PLD of claim 1 wherein the PLD is a part of a CPLD.

8. An integrated circuit (IC) comprising the PLD of claim 1.

9. A system on a programmable chip comprising the PLD of claim 1.

10. A programmable logic device (PLD) comprising:
    a programmable element programmed by one of a plurality of mutated programming patterns, each mutated programming pattern causing the programmable element to generate a mutated output causing the PLD to output the mutated output in response to the mutated programming patterns;
    a plurality of circuit elements, each circuit element translating into a normal output the mutated output from the programmable element when it is programmed by one of the plurality of mutated programming patterns causing the PLD to output the normal output in response to the one mutated programming pattern associated with a respective one of the mutated programming patterns; and
    a switching element for selecting one of the circuit elements for translating the mutated output from the programmable element.

11. The PLD of claim 10 wherein the switching element is controlled by a fuse logic circuit that detects whether at least one pre-determined fuse is blown.

12. The PLD of claim 10 wherein the PLD is part of a FPGA.

13. The PLD of claim 10 wherein the PLD is part of a CPLD.

14. A method of copy-protecting a programming pattern of a programmable logic device (PLD) comprising the steps of:
    fabricating a circuit element of the PLD, wherein the circuit element in response to a mutated signal, and without employing a decryption key, is capable of translating the mutated signal into a normal output signal of the PLD; and producing the programming pattern for programming a programmable element the PLD, the programming pattern causing the programmable element to generate the mutated signal.

15. The method of claim 14, wherein the step of fabricating further comprises producing a switching circuit enabling or disabling the programmable element.

16. The method of claim 14 wherein the PLD is part of a FPGA.

17. The method of claim 14 wherein the PLD is part of a CPLD.

18. A method of producing a mutable programmable logic device (PLD), comprising the steps of:
   producing a plurality of programming patterns for programming a programmable element of the PLD, each programming pattern causing the PLD to generate one of a plurality of mutated signals;
   fabricating a plurality of circuit elements disposed on the PLD, each circuit element translating one of the plurality of mutated signals into a normal output signal of the PLD; and
   fabricating a switching element for selecting one of the circuit elements for translating one of the plurality of mutated signals.

19. The method of claim 18, wherein the switching element is controlled by a fuse logic circuit that detects whether at least one pre-determined fuse is blown.

20. The method of claim 18 wherein the PLD is par of a FLGA.

21. The method of claim 18 wherein the PLD is par of a CPLD.

* * * * *